US006834367B2

(12) United States Patent
Bonneau et al.

(10) Patent No.: US 6,834,367 B2
(45) Date of Patent: Dec. 21, 2004

(54) BUILT-IN SELF TEST SYSTEM AND METHOD FOR HIGH SPEED CLOCK AND DATA RECOVERY CIRCUIT

(75) Inventors: Dominique P. Bonneau, La Rochette (FR); Philippe Hauviller, Evry (FR); Vincent Vallet, Mennecy (FR)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 09/745,988

(22) Filed: Dec. 21, 2000

(65) Prior Publication Data

US 2001/0016929 A1 Aug. 23, 2001

(30) Foreign Application Priority Data

Dec. 22, 1999 (EP) .............................................. 99480131

(51) Int. Cl.[7] .............................. G06F 11/00; H04B 1/38
(52) U.S. Cl. ........................ 714/738; 714/704; 714/742; 714/814; 714/815; 375/219; 375/224; 370/249; 370/366
(58) Field of Search ................................. 714/742, 815, 714/735, 736, 738, 700, 704, 715, 733, 739, 814; 375/219, 222, 224, 326, 358, 376; 324/73.1, 76.48, 763, 765; 370/242, 249, 366

(56) References Cited

U.S. PATENT DOCUMENTS

| 5,295,079 A | * | 3/1994 | Wong et al. ................. 714/715 |
| 5,381,085 A | * | 1/1995 | Fischer .................... 324/76.48 |
| 5,729,151 A | * | 3/1998 | Zoerner et al. .............. 324/765 |
| 5,787,114 A | * | 7/1998 | Ramamurthy et al. ...... 375/221 |
| 5,835,501 A | * | 11/1998 | Dalmia et al. .............. 714/704 |
| 5,956,370 A | * | 9/1999 | Ducaroir et al. ............ 375/221 |
| 6,201,829 B1 | * | 3/2001 | Schneider ................... 375/221 |
| 6,215,835 B1 | * | 4/2001 | Kyles ......................... 375/376 |

* cited by examiner

Primary Examiner—Emmanuel L. Moise
(74) Attorney, Agent, or Firm—Lawrence D. Cutter, Esq.; Heslin Rothenberg Farley & Mesiti P.C.

(57) ABSTRACT

A built-in self test system for testing a clock and data recovery circuit. The present invention provides a built-in self test circuit which operates with high speed phase lock loop. The built-in circuit comprises data generating means for generating a test data byte and serializing means coupled to the data generating means for converting the test data byte into serial test data. The clock and data recovery means are coupled to the output of the serializing means for recovering the clock and test data from the serial test data. A deserializing means coupled to the output of the clock and data recovery means converts the recovered serial test data into a recovered test data byte, and analyzing means connected to the output of the deserializing means compares the recovered test data byte to the initial test data byte.

36 Claims, 4 Drawing Sheets

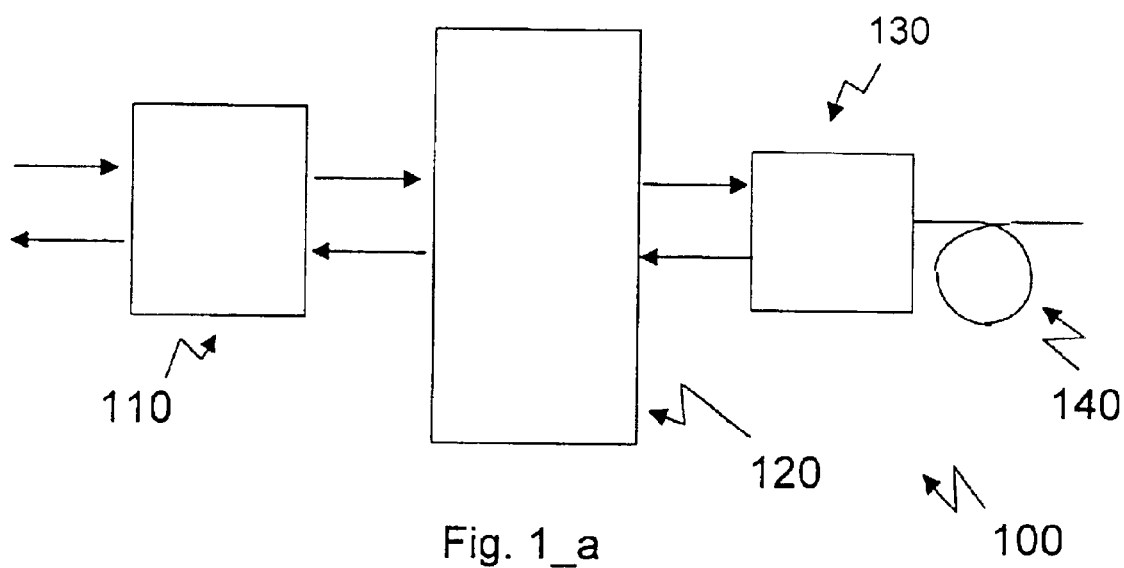
Fig. 1_a

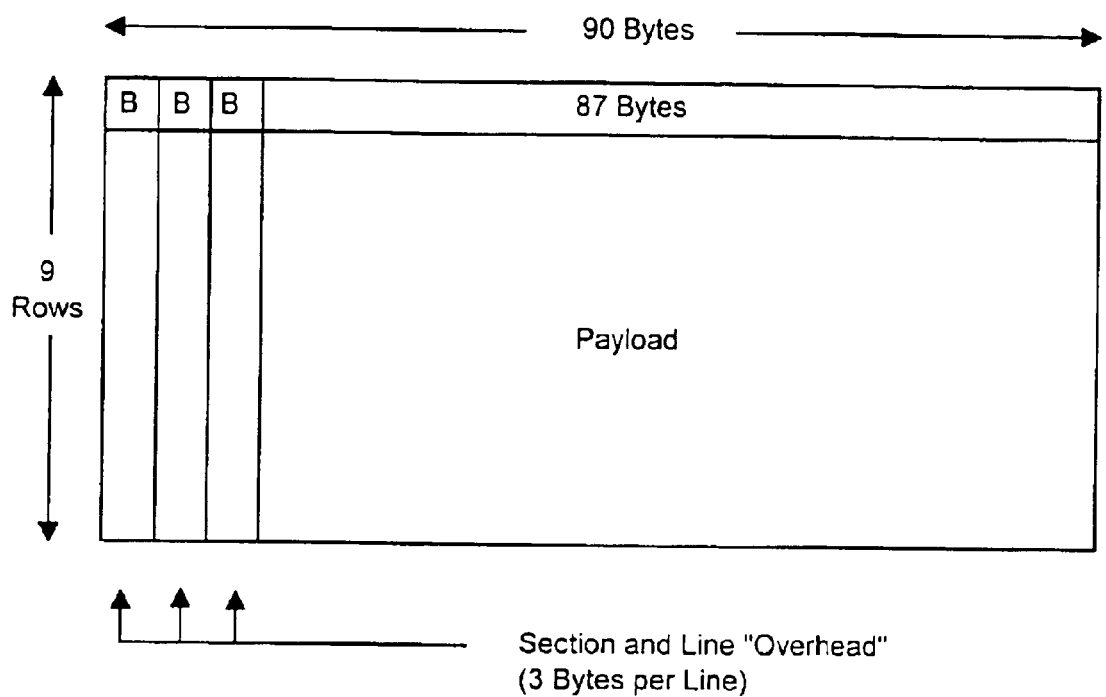
Fig. 1-b.

BUILT-IN SELF TEST SYSTEM AND METHOD FOR HIGH SPEED CLOCK AND DATA RECOVERY CIRCUIT

PRIOR FOREIGN APPLICATION

This application claims priority from European patent application number 99480131.4, filed Dec. 22, 1999, which is hereby incorporated herein by reference in its entirety.

TECHNICAL FIELD

The present invention relates to systems for testing clock and data recovery circuits, and more particularly to a built-in self test system.

BACKGROUND ART

In digital systems, digital data is typically handled with an associated clock signal. The clock provides timing necessary to allow digital circuitry to operate on digital data. When data are transmitted over a communications link, it is generally inefficient to also transmit the associated clock signal. This inefficiency has led to communications systems which transmit the data alone without the clock. Therefore, it is typical for fiber optic communication links to require that the clock signal at the receiving end of the link be extracted from the incoming data signal. To obtain the necessary clock at the receiving end, these systems employ clock and data recovery circuits. The clock and data recovery circuit derives the clock signal from the received digital data. Conventional clock and data recovery circuits are often implemented using phase-locked loops. In phase-locked loops, a reference clock is generated at the frequency of the received data using a voltage controlled oscillator (VCO). The phase-locked loop is often integrated onto a single chip along with logic circuits providing other link adapter functions.

In addition to clock recovery circuits, communications links often utilize serializers and deserializers circuits. Serializers on the transmitting side serialize the parallel data in a bit stream. Deserializers at the receiving end parallelize the serial data stream transmitted over the communications link. These parallel data are typically defined by bytes or words that make up the serial stream.

To eliminate defects from integrated circuits including logic circuits a well-known method consists to place observation latches (the famous LSSD latches) which are connected together to allow to scan out each signal which is generated internally. Test patterns sequences are performed at wafer level and if responding patterns do not match the test patterns, the failed circuits are sorted. Unfortunately this method cannot be used to detect defects in the analog circuits.

Conventional methods to test analog components consist in verifying the functionality of the analog circuitry by way of an external test equipment. Such method need that the chip be previously encapsulated before being tested at board level. The general state of the prior art with respect to solving the aforementioned testing problem may be best illustrated and understood with reference to the several patents to be described immediately hereinafter.

In U.S. Pat. No. 5,295,079 from Wong a digital testing system for very high frequency PLLs is proposed. The testing system allows the test of a PLL connected to an external digital tester via a bi-directional bus. The digital tester is an intelligent digital hardware that configures the PLL and extracts and interprets data from the PLL.

In U.S. Pat. No. 5,729,151 from Zoerner, the test of a phase lock loop within an integrated circuit is performed by an external testing device having access to an address/data bus coupled to both the PLL and a timer module which is utilized as a frequency counter for counting the number of clock pulses outputted from the PLL.

The aforementioned conventional methods employ an external testing equipment to test the PLL. Whereas such solutions are efficient to test high frequency PLLs, they are heavy in terms of cost and people, and in addition the permanent performance evolution of the products requires that the test equipment be adapted.

Alternative methods consist in using Built-in Self-Test (BIST) circuits.

In U.S. Pat. No. 5,802,073 from Platt, a built-in self-test (BIST) system for testing a network interface integrated circuit is disclosed. The BIST includes a random number generator to generate test data, and to monitor data going from a receiver of the network interface back to the BIST. The data is compressed into one number and compared with a predetermined signature in a signature analyzer. The BIST uses a functional system block for in-system diagnostic at system speed at a functional level as opposed to gate level.

In U.S. Pat. No. 5,835,501 from Dalmia, a built-in self-test circuit is provided to perform jitter tolerance tests on a clock and data recovery unit by using a pseudo-random data generating apparatus. The test is comprised of the steps of generating a jitter clock, using the jitter clock to generate a test data stream, feeding the test data stream to the clock and data recovery unit and determining the number of bits errors in the recovered data stream. This method requires that all the recovered bits be examined to determine the famous Bit Error Rate (BER) which is thus a time consuming solution.

SUMMARY OF THE INVENTION

Accordingly, it would be desirable to be able to provide a functional wafer level test system and method which allows full fault coverage of a clock and data recovery circuit.

The present invention provides a built-in self test apparatus for testing a clock and data recovery circuit which operates with high speed phase lock loop. The built-in circuit comprises data generating means for generating a test data byte and serializing means coupled to the data generating means for converting the test data byte into serial test data. The clock and data recovery means are coupled to the output of the serializing means for recovering the clock and test data from the serial test data. A deserializing means coupled to the output of the clock and data recovery means converts the recovered serial test data into a recovered test data byte, and analyzing means connected to the output of the deserializing means compares the recovered test data byte to the initial test data byte.

In a commercial application, the invention is preferably used in a high speed telecommunication framer which fulfill the requirements of the SONET technology.

It is another object of this invention to provide a method for testing a clock and data recovery circuit comprising the steps of:

generating an initial test data byte, inputting the test data byte to a serializer for conversion into serial test data, sending the serial test data to the clock and data recovery circuit for recovering the clock and the test data, inputting the recovered test data to a deserializer for conversion into a recovered test data byte, and comparing the recovered test data byte to the initial test data byte.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1-a shows a general block diagram of a preferred data communication system into which is incorporated the BIST circuit of the invention.

FIG. 1-b illustrates a SONET frame structure.

BEST MODE FOR CARRYING OUT THE INVENTION

Figure 2:
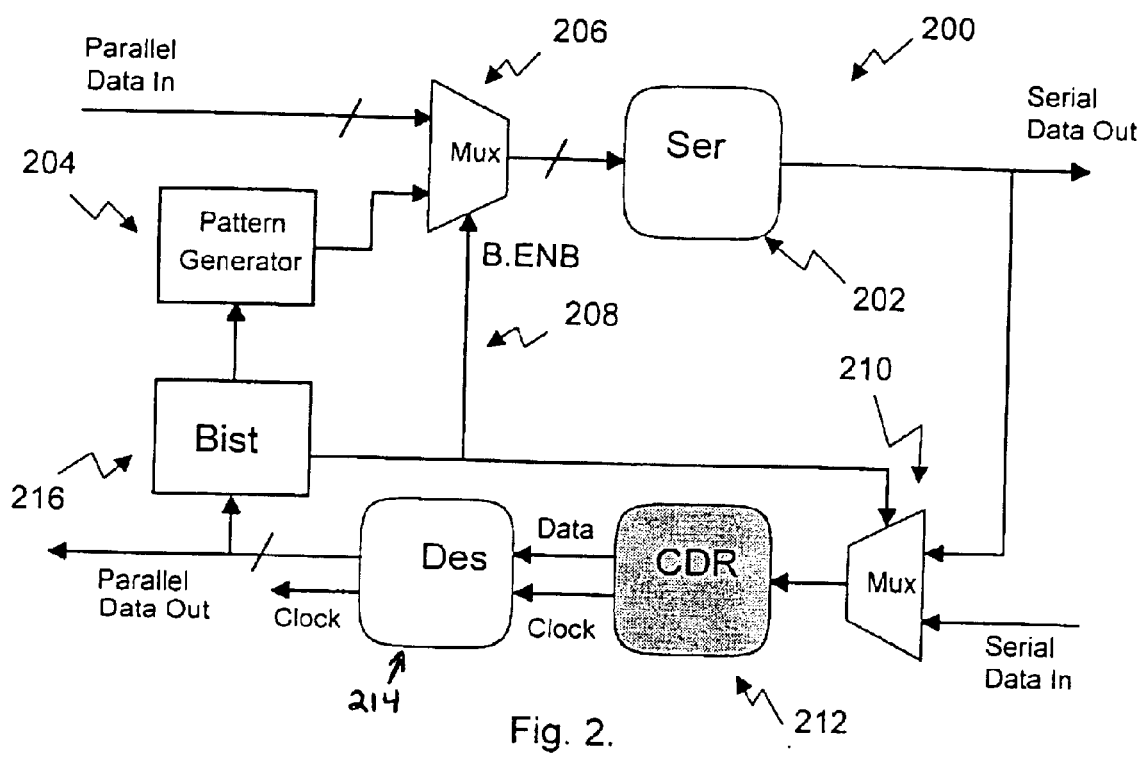
FIG. 2 shows a schematic block diagram of the built-in self test circuit of the present invention.

Referring to the drawings, and more particularly to FIG. 1, a general block diagram of part of a preferred data communication system into which is incorporated the BIST circuit of the invention is now described. The diagram is simplified for the purpose of understanding the principles of the invention. The system 100 is part of an optical transmission device and comprises a framer unit 110, a serializer/deserializer unit 120, an optical transceiver unit 130 and an optical fiber 140. Preferably such system is used in optical networking with SONET/SDH technology.

Synchronous Optical Network (SONET) is a U.S. standard for the international operations of optical networks. Fiber optics connect Asynchronous Transfer Mode (ATM), frame relay, Ethernet and other high-speed networks. SONET is a primary network transport mechanism of ATM systems. The SONET core can mix packages, or frames from different sources and carry them over a network. The basic structure in SONET is a frame of 810 bytes which is sent every 125 microseconds. This allows a single byte within a frame to be part of a 64 kilobits per second (Kbps) digital voice channel. Since the minimum frame size is 810 bytes then the minimum speed at which SONET operates is 51.84 megabits per second (mbps). The SONET signaling hierarchy is stated as Optical Carrier (OC) levels with OC-1 as the foundation transmission rate (51.840 Mbps). SONET is capable of reaching transmission rates of gigabits per second by using multiples of this rate (OC-3 level at 155.520 Mbps, OC-12 level at 622.080 Mbps, and OC-48 level at 2488.32 Mbps are currently the most widely supported multiples of OC-1).

The basic frame is called the Synchronous Transport Signal Level (STS-1). It is conceptualized in a two-dimensional frame as containing 9 rows of 90 columns each as shown in FIG. 1-b, but in reality it is a string of bits. The frame is transmitted row by row, from the top left to the bottom right. The first three columns of every row are used for administration and control of the system. Multiple STS-1 frames can be byte-multiplexed together to form higher-speed signals. When this is done they are called STS-2, STS-3 where the numeral suffix indicates the number of STS-1 frames that are present.

Referring again to FIG. 1-a, in normal mode of data transmission, a transmit serial bit stream in electrical form is presented to the optical transceiver 130 which encodes the data appropriately for transmission over the optical fiber 140. The transmit serial bit stream is issued from the serializer 120 which converts parallel frames to be transmitted into serial bit stream.

When operating on receiving path, the optical signal is fed to the optical transceiver for conversion in electrical form into a receive serial bit stream. The receive serial bit stream is recovered within a clock and data recovery circuit contained within the SER/DES unit 120. The recovered serial data are converted into receive parallel data by the deserializer 120. The receive parallel data are latter processed within framer 140.

In test mode, the SER/DES unit 120 operates internally as will be described in more detail with reference to FIG. 2. Generally, test parallel data are internally generated by a pattern generator in lieu of the operational data. Next they are fed to the serializer, and the serial data are wrapped to the clock and data recovery circuit for extracting the clock and retiming the data. The recovered data are next input to the deserializer, and the rebuilt bytes obtained by the deserialization process are compared to the initial test data generated by the pattern generator. The patterns are predefined to be made of a frame header signature followed by sequence of bits containing a maximum number of transitions such as '01010101 . . .'. The clock and data recovery unit may thus be easily lock on the data stream. In the case of a SONET frame, the frame header signature can be made of 6 bytes generally denoted 'A1,A1,A1,A2,A2,A2'. The test of the clock and data recovery circuit is performed by detecting this frame header in the deserializer circuit.

However, the test patterns may be adapted to fulfill the requirements of other technology.

Referring now to FIG. 2 a schematic block diagram of a preferred embodiment of the built-in self test circuit 200 of the present invention is described. The circuit 200 comprises a serializer 202 to input operational parallel data issued from internal circuitry or parallel test data generated by a pattern generator 204. A first multiplexer 206 is provided and has the operational parallel data and the test patterns as data inputs and has an internal selection bit value (B-ENB 208) as a data select input. A second multiplexer 210 having serial data received from optical transmission link and the output of the serializer 202 as data inputs is also provided. The second multiplexer also inputs the internal selection bit value (B-ENB 208) as data select input. The test patterns and the output of the serializer 202 are the selected data inputs for respectively the first and the second multiplexer (206, 210) when the internal selection bit signal is set to activate the self test mode. A clock and data recovery circuit 212 is connected to the output of the second multiplexer 210 to perform the clock extraction and data regeneration in a well-known manner. A deserializer 214 connected to the output of the clock and data recovery circuit parallelizes the recovered serial data. A state machine 216 connected to the output of the deserializer comprises means to compare the recovered data bytes to the initial test pattern. A signature signal (SIG) is generated to validate the reconstruction of the initial data pattern and to stop the test data generation by disabling the pattern generator. The state machine 216 further includes conventional time out counters. A first counter is initialized before the test is performed to wait for the phase lock loop to lock to a predetermined frequency. A second counter allows during a predefined period of time that numerous test patterns be repetitively generated as long as the recovered test patterns do not match the expected ones. Preferably, the pattern generator is a programmable circuit to provide different test sequences.

Figure 3:
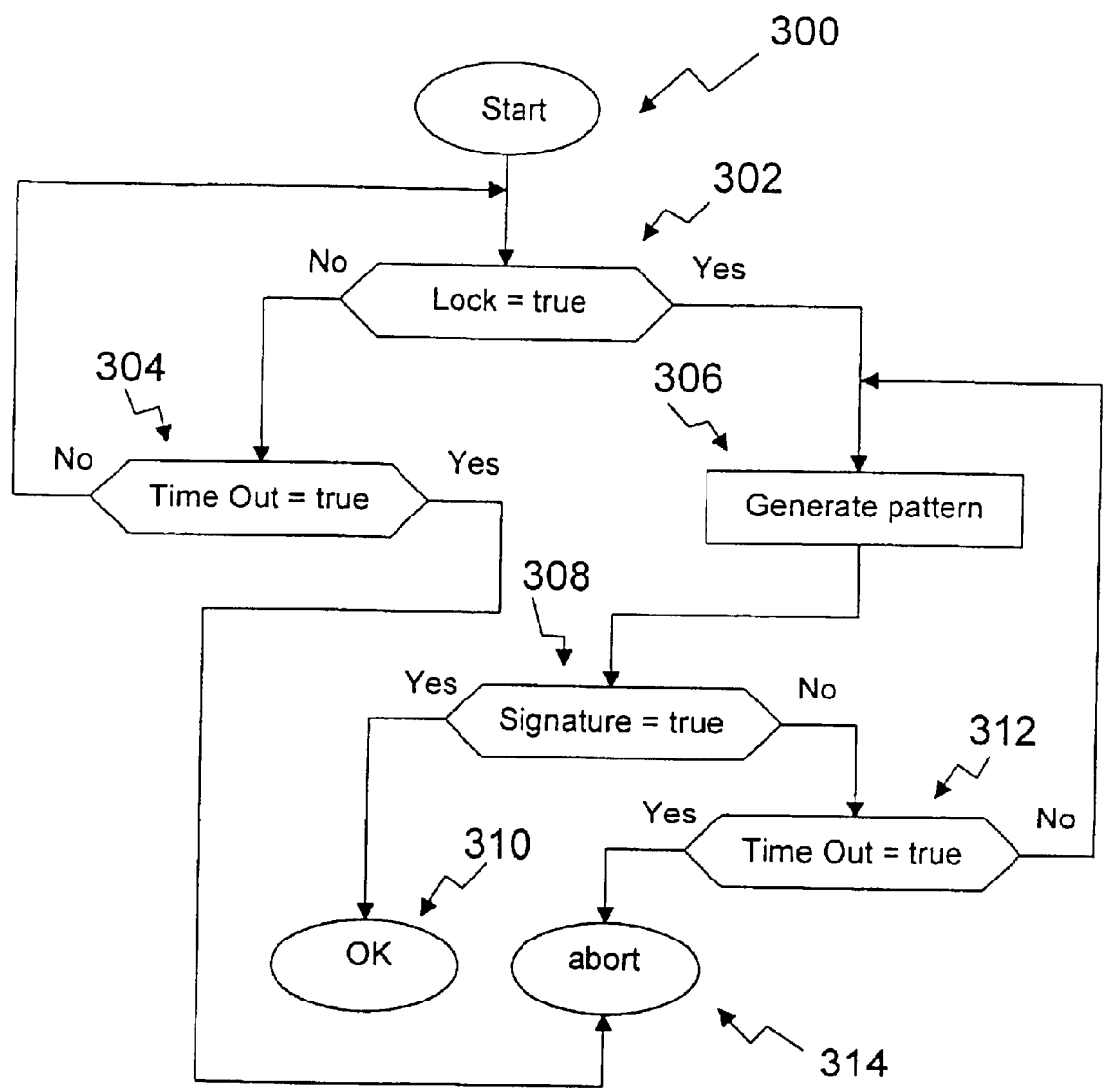
FIG. 3 is a flow chart illustrating the state machine process to operate the circuit of FIG. 2.

FIG. 3 is a flow chart for illustrating the state machine process of the invention.

Though not shown on the initial state (300), the built-in self test sequence is started by the assertion of the internal selection bit (B-ENB) to place the circuit 200 in test mode. A first test frame is provided to the clock and data recovery circuit via the serializer as previously described.

Thereafter the state machine enters a lock state (302) to wait for the voltage control oscillator contained in the CDR circuit to lock to the reference frequency. A first count state (304) illustrates running of a first time counter to loop back (branch No) to lock state (302) until the VCO is lock. If the counting ends before the VCO is lock (branch Yes) the process aborts (state 314).

Back to lock state (302), when the VCO is lock to the reference frequency, a first test frame which has been serialized thru serializer (202) is recovered within the CDR (212) and a first result test frame is analyzed on check state (308). The test loops to state (306) to generate continuously the test pattern until the serial data stream is on phase with the VCO. If the result test frame matches the initial test frame (the expected signature), the test process is ended (state 310).

Thus test patterns are sequentially generated until the result of the comparison is 'match' (state 310) or until the time counter is ended (state 312). If the time counter is ended before a successful comparison test the process aborts (state 314).

It is to be noted that no specific test pattern have been mentioned for operating the built-in self test of the invention. It is an advantage of the invention that different types of test pattern may be applied to check the functionality of the PLL as well as its stability in case of programmed patterns with low transition rate.

In one embodiment, the BIST circuit is in the form of a high level logic description (VHDL) code to describe the function of the logic circuitry as described above. However, logic circuits may be designed at the gate level in other embodiments.

While the invention has been particularly shown and described with reference to a preferred embodiment thereof, it will be understood by those skilled in the art that various changes in form and details may be made without departing from the spirit and scope of the invention.

What is claimed is:

1. A built-in self test circuit for testing a clock and data recovery circuit comprising:
   data generating means for generating test data, wherein the test data comprises a frame header;
   serializing means coupled to the data generating means for converting the test data into serial test data;
   clock and data recovery means coupled to the output of the serializing means for recovering the clock and test data from the serial test data;
   deserializing means coupled to the output of the clock and data recovery means for converting the recovered serial test data into recovered test data; and
   analyzing means connected to the output of the deserializing means for comparing a beginning portion of the recovered test data to the frame header,
   wherein a match between the beginning portion of the recovered test data and the frame header indicates a proper operation of said clock and data recovery circuit.

2. The circuit of claim 1 wherein said clock and data recovery means comprises a phase lock loop.

3. The circuit of claim 2 further comprising a multiplexer coupled to the clock and data recovery means for inputting operational serial data or said serial test data upon setting of a data selection signal (B-ENB).

4. The circuit of claim 2 further comprising a first multiplexer coupled to the serializing means for inputting operational parallel data or said test data upon setting of a data selection signal (B-ENB).

5. The circuit of claim 4 further comprising a second multiplexer coupled to the clock and data recovery circuit for inputting operational serial data or said serial test data upon setting of a data selection signal (B-ENB).

6. The circuit of claim 5 wherein said test data is in the form of a SONET frame, and said analyzing means comprises means for detecting the start of a SONET frame.

7. The circuit of claim 6 further comprising a state machine to control said generating means and said analyzing means.

8. The circuit of claim 7 wherein said data generating means is a programmable data generator.

9. The circuit of claim 1 further comprising a multiplexer coupled to the serializing means for inputting operational parallel data or said test data upon setting of a data selection signal (B-ENB).

10. The circuit of claim 1 further comprising a multiplexer coupled to the clock and data recovery circuit for inputting operational serial data or said serial test data upon setting of a data selection signal (B-ENB).

11. The circuit of claim 1 wherein said test data is in the form of a SONET frame, and said analyzing means comprises means for detecting the start of a SONET frame.

12. The circuit of claim 1 further comprising a state machine to control said generating means and said analyzing means.

13. The circuit of claim 1 wherein said data generating means is a programmable data generator.

14. A method for testing a clock and data recovery circuit comprising:
   generating initial test data, wherein the initial test data comprises a frame header;
   inputting the initial test data to a serializer for conversion into serial test data;
   sending the serial test data to the clock and data recovery circuit for recovering the clock and test data from the serial test data;
   inputting the recovered serial test data to a deserializer for conversion into recovered test data; and
   comparing a beginning portion of the recovered test data to the frame header,
   wherein a match between the beginning portion of the recovered test data and the frame header indicates a proper operation of said clock and data recovery circuit.

15. The method of claim 14 wherein said clock and data recovery circuit comprises a phase lock loop.

16. The method of claim 15 further comprising an initial step of waiting for a predetermined period of time to allow said phase lock loop to lock to a predetermined frequency before beginning of said generating.

17. The method of claim 16 further comprising:
   generating new test data; and
   repeating said serializing, recovering, deserializing and comparing until the beginning portion of the recovered test data matches the frame header.

18. The method of claim 17 wherein said generating new test data and said repeating are performed until a counter reaches a predetermined number of pulses.

19. The method of claim 18 wherein said generating and said comparing are controlled by a state machine.

20. The method of claim 19 wherein said counter is included within said state machine.

21. The method of claim 14 further comprising an initial step of waiting for a predetermined period of time to allow said phase lock loop to lock to a predetermined frequency before beginning of said generating.

22. The method of claim 14 further comprising:
generating new test data; and
repeating said serializing, recovering, deserializing and comparing until the beginning portion of the recovered test data matches the frame header.

23. The method of claim 14 wherein said generating and said comparing are controlled by a state machine.

24. A built-in self test circuit for testing a clock and data recovery circuit comprising:
data generating means for generating a test data byte;
serializing means coupled to the data generating means for convening the test data byte into serial test data;
clock and data recovery means coupled to the output of the serializing means for recovering the clock and test data from the serial test data;
deserializing means coupled to the output of the clock and data recovery means for convening the recovered serial test data into a recovered test data byte; and
analyzing means connected to the output of the deserializing means for comparing the recovered test data byte to the test data byte,
wherein an outcome of said testing comprises indicating improper operation of the clock and data recovery means.

25. The circuit of claim 24 wherein said clock and data recovery means comprises a phase lock loop.

26. The circuit of claim 25 further comprising a multiplexer coupled to the clock and data recovery means for inputting operational serial data or said serial test data upon setting of a data selection signal (B-ENB).

27. The circuit of claim 25 further comprising a first multiplexer coupled to the serializing means for inputting operational data byte or said test data byte upon setting of a data selection signal (B-ENB).

28. The circuit of claim 27 further comprising a second multiplexer coupled to the clock and data recovery circuit for inputting operational serial data or said serial test data upon setting of a data selection signal (B-ENB).

29. The circuit of claim 28 wherein said test data byte is in the form of a SONET frame, and said analyzing means comprises means for detecting the start of a SONET frame.

30. The circuit of claim 29 further comprising a state machine to control said generating means and said analyzing means.

31. The circuit of claim 30 wherein said data generating means is a programmable data generator.

32. The circuit of claim 24 further comprising a multiplexer coupled to the serializing means for inputting operational data byte or said test data byte upon setting of a data selection signal (B-ENB).

33. The circuit of claim 24 further comprising a multiplexer coupled to the clock and data recovery circuit for inputting operational serial data or said serial test data upon setting of a data selection signal (B-ENB).

34. The circuit of claim 24 wherein said test data byte is in the form of a SONET frame, and said analyzing means comprises means for detecting the start of a SONET frame.

35. The circuit of claim 24 further comprising a state machine to control said generating means and said analyzing means.

36. The circuit of claim 24 wherein said data generating means is a programmable data generator.

* * * * *

UNITED STATES PATENT AND TRADEMARK OFFICE
CERTIFICATE OF CORRECTION

| | |
|---|---|
| PATENT NO. | : 6,834,367 B2 |
| DATED | : December 21, 2004 |
| INVENTOR(S) | : Bonneau et al. |

It is certified that error appears in the above-identified patent and that said Letters Patent is hereby corrected as shown below:

Column 7,
Lines 20 and 25, delete the word "convening" and insert the word -- converting --

Signed and Sealed this

Fifth Day of April, 2005

JON W. DUDAS
*Director of the United States Patent and Trademark Office*